US011851332B2

(12) United States Patent
Yan et al.

(10) Patent No.: US 11,851,332 B2
(45) Date of Patent: Dec. 26, 2023

(54) SILICON-CARBON COMPOSITE MATERIAL AND PREPARATION METHOD THEREOF

(71) Applicant: Guangdong Kaijin New Energy Technology Co., Ltd., Dongguan (CN)

(72) Inventors: Luo Yan, Guangdong (CN); Anhua Zheng, Guangdong (CN); Yongjun Yang, Guangdong (CN)

(73) Assignee: Guangdong Kaijin New Energy Technology Co., Ltd., Dongguan (CN)

( * ) Notice: Subject to any disclaimer, the term of this patent is extended or adjusted under 35 U.S.C. 154(b) by 196 days.

(21) Appl. No.: 17/343,763

(22) Filed: Jun. 10, 2021

(65) Prior Publication Data
US 2022/0048774 A1   Feb. 17, 2022

Related U.S. Application Data

(63) Continuation of application No. PCT/CN2019/082319, filed on Apr. 11, 2019.

(30) Foreign Application Priority Data

Jan. 24, 2019   (CN) .......................... 201910069128.6

(51) Int. Cl.
*C01B 32/194*   (2017.01)
*C01B 33/021*   (2006.01)
(Continued)

(52) U.S. Cl.
CPC .......... *C01B 32/194* (2017.08); *C01B 33/021* (2013.01); *C23C 16/22* (2013.01);
(Continued)

(58) Field of Classification Search
CPC ..... C01B 32/194; C01B 33/021; C01B 32/05; C01B 33/029; C23C 16/22;
(Continued)

(56) References Cited

U.S. PATENT DOCUMENTS

2016/0211511 A1* 7/2016 Ren ..................... H01M 4/386

FOREIGN PATENT DOCUMENTS

CN   105552323 A   5/2016
CN   104103821 B   8/2016
(Continued)

OTHER PUBLICATIONS

Decision to Grant of counterpart Japanese Patent Application No. 2021-508047 dated Mar. 29, 2022.
(Continued)

*Primary Examiner* — Daniel C. McCracken

(57) ABSTRACT

A silicon-carbon composite material includes a matrix core, a silicon-carbon composite shell formed by uniformly dispersing nano silicon particles in conductive carbon, and a coating layer. The nano silicon particles are formed by high-temperature pyrolysis of a silicon source, and the conductive carbon is formed by high-temperature pyrolysis of an organic carbon source. The coating layer is a carbon coating layer including at least one layer, and the thickness of its single layer is 0.2-3 μm. A silicon-carbon composite material precursor is formed by simultaneous vapor deposition and is then subjected to carbon coating to form the pitaya-like silicon-carbon composite material which has advantages of high first-cycle efficiency, low expansion and long cycle. The grain growth of the silicon material is slowed down during the heat treatment process, the pulverization of the material is effectively avoided, and the cycle performance, conductivity and rate performance of the material are enhanced.

11 Claims, 3 Drawing Sheets

(51) Int. Cl.
*C23C 16/22* (2006.01)
*C23C 16/455* (2006.01)
*C23C 16/52* (2006.01)
*C23C 16/56* (2006.01)
*B82Y 30/00* (2011.01)
*B82Y 40/00* (2011.01)

(52) U.S. Cl.
CPC ........ *C23C 16/45553* (2013.01); *C23C 16/52* (2013.01); *C23C 16/56* (2013.01); *B82Y 30/00* (2013.01); *B82Y 40/00* (2013.01); *C01P 2004/61* (2013.01); *C01P 2006/10* (2013.01); *C01P 2006/12* (2013.01); *C01P 2006/40* (2013.01)

(58) Field of Classification Search
CPC ... C23C 16/45553; C23C 16/52; C23C 16/56; C23C 16/24; C23C 16/26; C23C 16/4417; B82Y 30/00; B82Y 40/00; C01P 2004/61; C01P 2006/10; C01P 2006/12; C01P 2006/40; Y02E 60/10; H01M 4/1395; H01M 4/36; H01M 4/38; H01M 4/62; H01M 10/0525; H01M 4/366; H01M 4/386; H01M 4/625
See application file for complete search history.

(56) References Cited

FOREIGN PATENT DOCUMENTS

| | | |
|---|---|---|
| CN | 108390049 A | 8/2018 |
| CN | 109119627 A | 1/2019 |
| DE | 102014208274 A1 | 11/2015 |
| KR | 20030075132 A | 9/2003 |
| KR | 20160044969 A | 4/2016 |
| KR | 20170069163 A | 6/2017 |

OTHER PUBLICATIONS

Notice of Reasons for Refusal of counterpart Japanese Patent Application No. 2021-508047 dated Sep. 21, 2021.
Written Decision on Registration of counterpart Korean Patent Application No. 10-2020-7030015 dated Feb. 20, 2023.
Oct. 24, 2019 Written Opinion of the International Searching Authority issued in International Patent Application No. PCT/CN2019/082319.
International Search Report of PCT Patent Application No. PCT/CN2019/082319 dated Oct. 24, 2019.

\* cited by examiner

SILICON-CARBON COMPOSITE MATERIAL AND PREPARATION METHOD THEREOF

TECHNICAL FIELD

The invention relates to the technical field of new energy materials, in particular to a silicon-carbon composite material and a preparation method thereof.

DESCRIPTION OF RELATED ART

Secondary batteries have been widely used in portable electronic products. With the development of miniaturized portable electronic products and the increasing demand for secondary batteries in the aviation, military and automotive industries, it is urgent to substantially improve both the capacity and energy density of the batteries. At present, the commercial anode materials are mainly graphite materials, but because of their low theoretical capacity (372 mAh/g), they cannot meet the demands of the market. In recent years, people's attention has been paid on new high specific capacity anode materials: lithium storage metals and their oxides (such as Sn and Si) and lithium transition metal phosphides. Si has become one of the most potential alternative materials for replacing graphite due to its high theoretical specific capacity (4200 mAh/g), but Si base is prone to cracking and pulverization due to its huge volume effect during charge and discharge, thereby losing contact with the current collector, resulting in a sharp drop in cycle performance. Therefore, how to reduce the volume expansion effect and improve the cycle performance is of great significance to the application of silicon materials in lithium-ion batteries.

In the prior art, Chinese Patent Application Publication No. 105552323A discloses a silicon/silicon oxycarbide/carbon anode material and its preparation method and application, where ultra-small siloxycarbon nanoparticles are uniformly dispersed in the carbon matrix as the buffer matrix, while silicon nanoparticles are evenly embedded in the carbon/siloxycarbon buffer matrix. Although the anode active material has high capacity and good cycle performance, its first-cycle efficiency is low, which limits its application in lithium-ion batteries. Chinese Patent Publication No. 104103821B discloses a method for preparing a silicon-carbon anode material, where a metal catalyst is used to first decompose a silicon source to prepare a precursor Si-SiOx, and then the Si-SiOx prepared by the reaction and the carboxylated carbon matrix are compounded in a dynamic rotating deposition chamber through a carrier gas to prepare a precursor of the silicon-carbon anode material, and finally carbon coating is performed to obtain the silicon-carbon anode material. This method can prepare high capacity nano silicon, but since nano silicon cannot be uniformly distributed on the surface of the carbon matrix, there are hidden dangers such as unsatisfactory cycle performance and high volume expansion.

For this reason, it is indeed desired to develop a silicon-carbon composite material and a preparation method thereof to overcome such technical difficulties in the prior art that silicon-based materials have a huge volume effect during charge and discharge, and are prone to cracking and pulverization, thereby losing contact with the current collector and further causing a sharp drop in cycle performance, and the large volume effect and low conductivity of the silicon-based anode active materials lead to its poor cycle performance and poor rate performance.

SUMMARY OF THE INVENTION

In view of the above-mentioned shortcomings of the prior art, the objective of the invention is to provide a silicon-carbon composite material and a preparation method thereof. A silicon-carbon composite material precursor is formed by simultaneous vapor deposition, and then is subjected to carbon coating to form a pitaya-like silicon-carbon composite material with the advantages of high first-cycle efficiency, low expansion and long cycle. According to the invention, the grain growth of the silicon material is slowed down during the heat treatment process, the pulverization of the material is effectively avoided during the cycle, the volume expansion effect of the silicon-based material is alleviated, and the cycle performance, conductivity and rate performance of the material can be enhanced.

To achieve the above objective, the technical solutions of the invention are as follows:

A silicon-carbon composite material which is a pitaya-like composite material comprises a matrix core, a silicon-carbon composite shell and a coating layer. The silicon-carbon composite shell is formed by uniformly dispersing a number of nano silicon particles in conductive carbon, the nano silicon particles are formed by the high-temperature pyrolysis of a silicon source, and the conductive carbon is formed by the high-temperature pyrolysis of an organic carbon source. The coating layer is a carbon coating layer including at least one layer, and the thickness of its single layer is 0.2-3 μm. The thickness of the single-layer of the carbon coating layer is preferably 0.2-2 μm, particularly preferably 0.2-1 μm. The pitaya-like structure can effectively alleviate the volume effect of the silicon-based material during the charge and discharge process, thereby effectively avoiding the pulverization of the material during the cycle. A good carbon conductive mesh can enhance the electric conductivity of the material, improve the rate performance of the material, alleviate the volume expansion effect of the silicon-based material, and improve the cycle performance of the material.

Preferably, the particle size D50 of the silicon-carbon composite material is 2-20 m, more preferably 2-15 μm, particularly preferably 2-10 am. The specific surface area of the silicon-carbon composite material is 1-30 m$^2$/g, further preferably 2-20 m$^2$/g, particularly preferably 2-8 m$^2$/g. The true density of the silicon-carbon composite material is 1-3 g/cm$^3$, further preferably 1.5-2.5 g/cm$^3$, particularly preferably 2.0-2.5 g/cm$^3$. The particle size D50 of the matrix core of the silicon-carbon composite material is 2-18 μm, more preferably 2-15 μm, particularly preferably 2-8 μm.

Preferably, the matrix core includes any one or two of nano silicon, nano silicon oxide, and a nano conductive carbon material; nano silicon includes any one or more of single-crystal nano silicon with a grain size of 1-40 nm, polycrystalline nano silicon with a grain size of 1-40 nm or amorphous nano silicon, and the grain size of the nano silicon is more preferably 2-20 nm, particularly preferably 2-10 nm; the particle size D50 of nano silicon is 5-300 nm, more preferably 10-200 nm, particularly preferably 10-100 nm; X in nano SiOx is 0.8-1.5, preferably 0.8-1.3, particularly preferably 0.8-1.1; the nano conductive carbon material is conductive carbon black, carbon nanotubes or graphene.

Preferably, the single-crystal nano silicon is a single-crystal nano silicon wire prepared on a gold-plated silicon wafer by a chemical vapor deposition method.

Preferably, the nano conductive carbon material graphene is a graphene composite material loaded with amorphous carbon.

Preferably, the graphene composite material loaded with amorphous carbon is prepared in the following way: mixing a graphene oxide solution uniformly dispersed at a single layer with amorphous carbon, stirring at room temperature, drying, performing preheating treatment under an inert gas atmosphere, cooling, performing reduction reaction in a reducing atmosphere, and cooling.

A preparation method of the silicon-carbon composite material, including the following steps:

S1: placing a matrix core in a CVD furnace, heating up the furnace to a temperature of 400-1200° C. at a rate of 1-15° C./min under a protective atmosphere and simultaneously vapor-deposit nano silicon particles and conductive carbon, keeping the furnace at the temperature for 0.5-20 h, and cooling the furnace to room temperature naturally, thereby obtaining a silicon-carbon composite precursor;

S2: performing carbon coating on the silicon-carbon composite material precursor, thereby obtaining the silicon-carbon composite material.

Preferably, the simultaneous vapor deposition of nano silicon particles and conductive carbon layer can be implemented by introducing a carbon source and a silicon source at a certain ratio simultaneously or alternately. The simultaneous vapor deposition of nano silicon particles and conductive carbon is implemented by introducing the carbon source and the silicon source at a ratio of 1:1-99 simultaneously or alternately at a rate of 0.5-20.0 L/min. The silicon source includes one or more of $SiH_4$, $SiHCl_3$, $Si_2H_6$, $Si_3Hg$, $SiCl_4$, $Si_2Cl_6$, $SiH_2Cl$, and $SiH_3Cl$. More preferably, the CVD furnace is a rotary furnace with a rotation speed of 0.2-5.0 rpm. The protective gas includes one or more of nitrogen, helium, neon, argon, krypton, and xenon. The organic carbon source gas is one or more of methane, propane, isopropane, butane, isobutane, ethylene, propylene, acetylene, butene, vinyl chloride, vinyl fluoride, vinyl difluoride, ethyl chloride, fluoroethane, difluoroethane, methyl chloride, fluoromethane, difluoromethane, trifluoromethane, methylamine, formaldehyde, benzene, toluene, xylene, styrene, and phenol.

Preferably, the carbon coating is high-temperature pyrolysis carbon coating, or liquid-phase carbon coating or gas-phase carbon coating. The high-temperature pyrolysis carbon coating is one-step carbon coating or two-step carbon coating. In the case of two-step carbon coating with first and second coating processes, the coating amount of the second carbon coating process is 0.1-10 times, by mass, that of the first carbon coating process. The thickness of the coating layer formed by the carbon coating is 10-2000 nm, more preferably 10-1500 nm, and particularly preferably 10-1000 nm. The two-step carbon coating also can includes a liquid-phase carbon coating process and a gas-phase carbon coating process following the liquid-phase carbon coating process or include a gas-phase carbon coating process and a liquid-phase carbon coating process following the gas-phase carbon coating process.

Preferably, the liquid-phase carbon coating process includes: uniformly mixing and dispersing an organic carbon source, a to-be-coated material, and a solvent by a high-speed disperser to form a slurry, performing spray drying and heat treatment on the slurry, introducing a high-purity protective gas into an atmosphere furnace in which the slurry after heat treatment is placed, heating the atmosphere furnace up to a temperature of 400-1200° C. at a heating rate of <10° C./min for sintering, keeping the atmosphere furnace at the temperature for 0.5-10 h, and then cooling the atmosphere furnace to room temperature naturally, thus obtaining a liquid-phase coating product. The mass of the pyrolysis carbon from the organic carbon source accounts for 1-99 wt % of the total mass of the composite material formed by the pyrolysis carbon from the organic carbon source and the to-be-coated material. The solid content of the slurry is controlled to 5-50% by adjusting the amount of the solvent added.

More preferably, in the case of liquid-phase carbon coating, the organic carbon source includes one or more of sucrose, glucose, citric acid, phenolic resin, epoxy resin, pitch, polypyrrole, polypyrrolidone, polyaniline, polyacrylonitrile, polydopamine and polyvinyl alcohol. The solvent includes one or more of water, an alcohol solvent, a ketone solvent, an alkane solvent, N-methylpyrrolidone, tetrahydrofuran, and toluene. The alcohol solvent includes one or more of ethanol, methanol, ethylene glycol, isopropanol, n-octanol, propenol, and octanol. The ketone solvent includes acetone, methyl methyl ethyl ketone, methyl isobutyl ketone, methyl ethyl ketone, methyl isoacetone, cyclohexanone, and methyl hexanone. The alkane solvent includes cyclohexane, n-hexane, isoheptane, 3,3-dimethylpentane, and 3-methylhexane. The protective gas includes one or more of nitrogen, argon, and argon-hydrogen mixed gas.

Preferably, the gas-phase carbon coating includes: placing a to-be-coated material in a CVD furnace, introducing a protective gas into the CVD furnace, heating up the CVD furnace to a temperature of 500-1200° C. at a rate of 1-15° C./min, introducing an organic carbon source gas into the CVD furnace at an inputting rate of 0.5-20.0 L/min, keeping the CVD furnace at the temperature for 0.5-20 h, and then cooling the CVD furnace to room temperature naturally, thus obtaining a gas-phase coating product.

More preferably, in the case of gas-phase carbon coating, the CVD furnace is a rotary furnace with a rotation speed of 0.2-5.0 rpm; the protective gas includes one or more of nitrogen, helium, neon, argon, krypton, and xenon; the organic carbon source gas includes one or more of methane, propane, isopropane, butane, isobutane, ethylene, propylene, acetylene, butene, vinyl chloride, vinyl fluoride, vinyl difluoride, ethyl chloride, fluoroethane, difluoroethane, methyl chloride, fluoromethane, difluoromethane, trifluoromethane, methylamine, formaldehyde, benzene, toluene, xylene, styrene, and phenol.

The invention has the following beneficial effects as compared with the prior art.

1. The pitaya-like silicon-carbon composite material of the invention includes a matrix core, a silicon-carbon composite shell covered over the matrix core and a coating layer coated on the silicon-carbon composite shell. The silicon-carbon composite shell is formed by uniformly dispersing nano silicon particles in conductive carbon, wherein Low-temperature deposited nano silicon contains a large amount of amorphous silicon which has small volume expansion, thereby effectively avoiding the pulverization of the material during the cycle, improving the cycle performance of the material; and the internal conductive matrix can improve the conductivity of the material, improve the rate performance of the material, alleviate the volume expansion effect of the silicon-based material, and improve the cycle performance of the material.

2. The pitaya-like silicon-carbon composite material of the invention is prepared by firstly performing simultaneous vapor deposition to obtain nano-silicon particles uniformly dispersed in the conductive carbon layer, and then performing coating treatment. The lithium ion battery prepared by using the material can show good cycle performance and rate performance.

The above is an overview of the technical solutions of the invention. The following is a further description of the invention with reference to the drawings and specific embodiments.

DETAILED DESCRIPTION OF THE INVENTION

Figure 1:
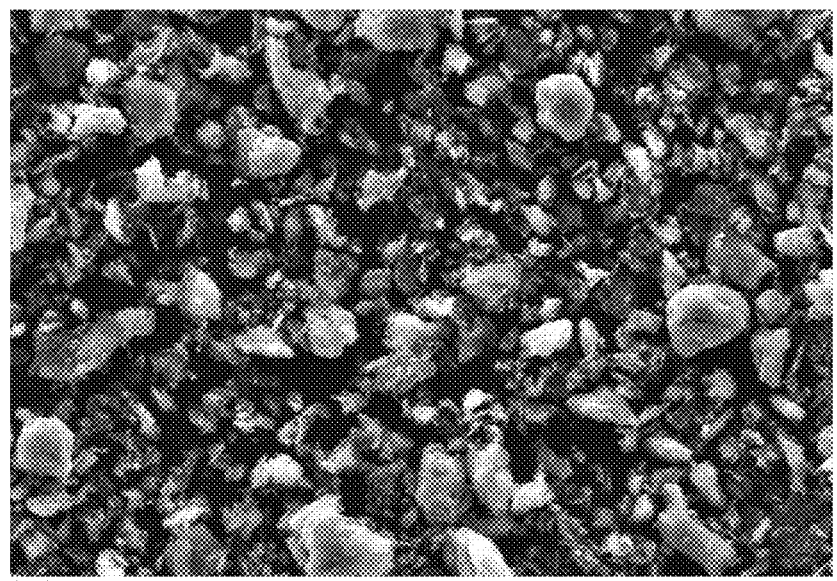
FIG. 1 is an SEM image of a silicon-based composite material in Embodiment 1 of the present invention.
Figure 2:
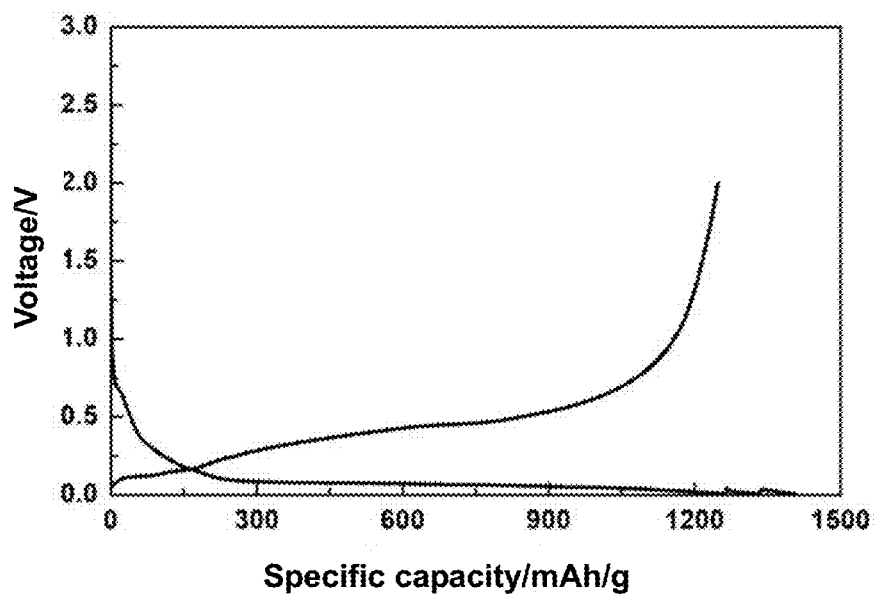
FIG. 2 is a first charge and discharge curve of the silicon-based composite material in Example 1 of the invention.
Figure 3:
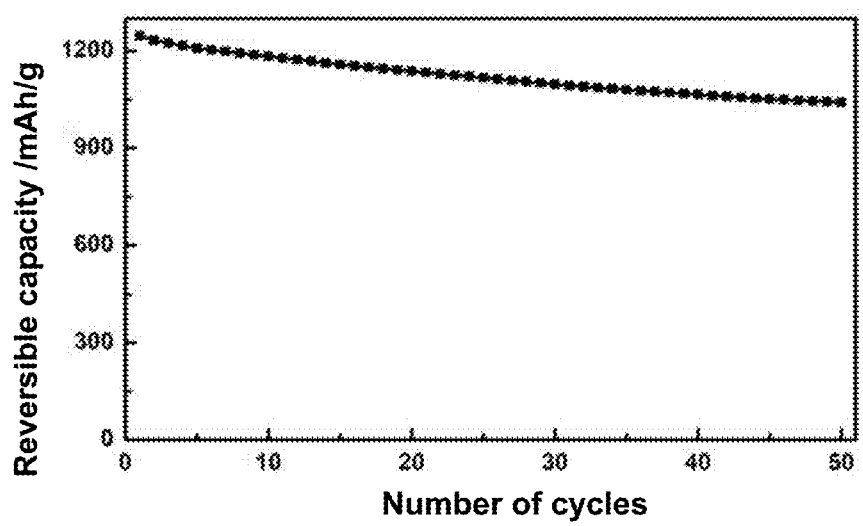
FIG. 3 is a cycle performance curve of the silicon-based composite material in Example 1 of the invention.
Figure 4:
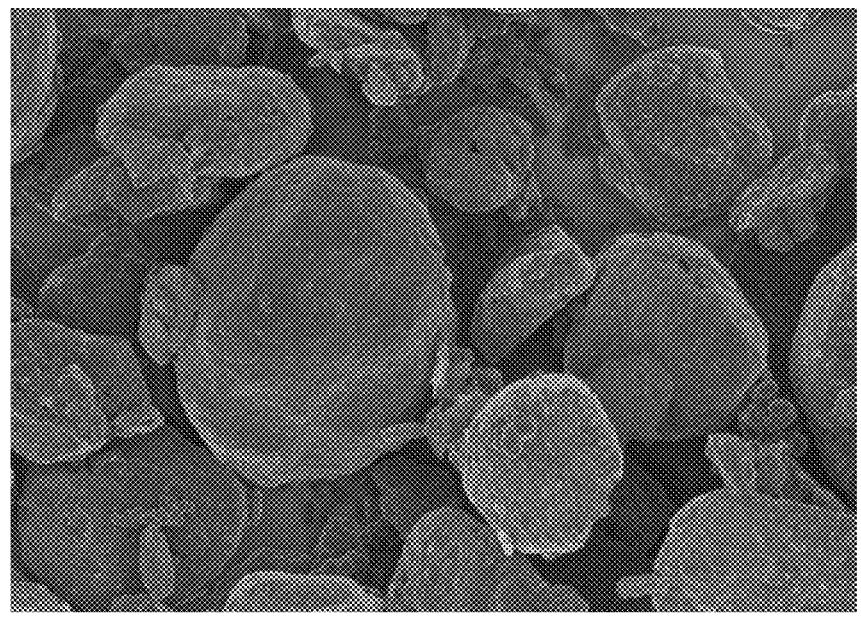
FIG. 4 is an SEM image of a silicon-based composite material in Embodiment 3 of the invention.
Figure 5:
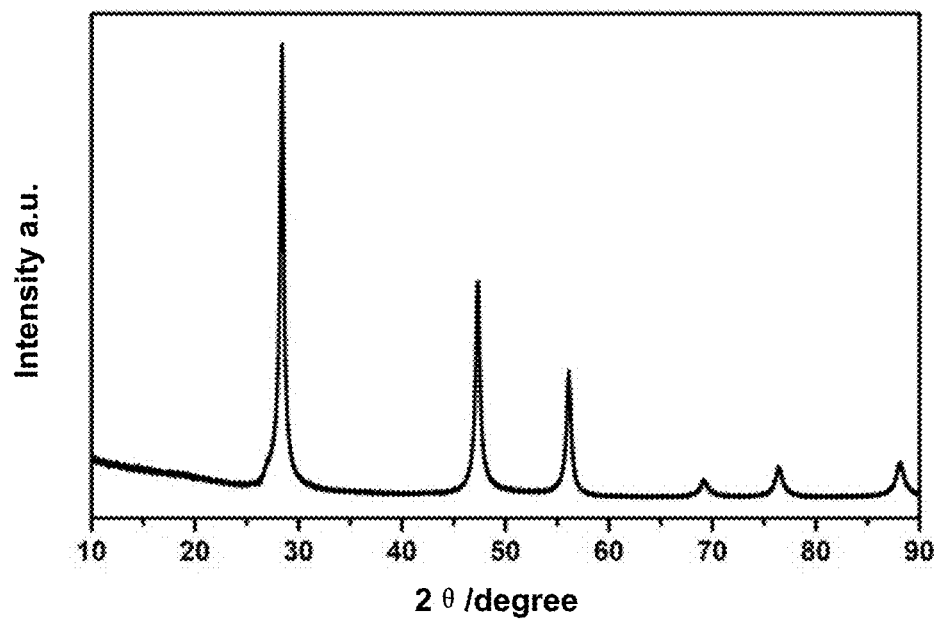
FIG. 5 is an XRD pattern of the silicon-based composite material in Embodiment 3 of the invention.
Figure 6:
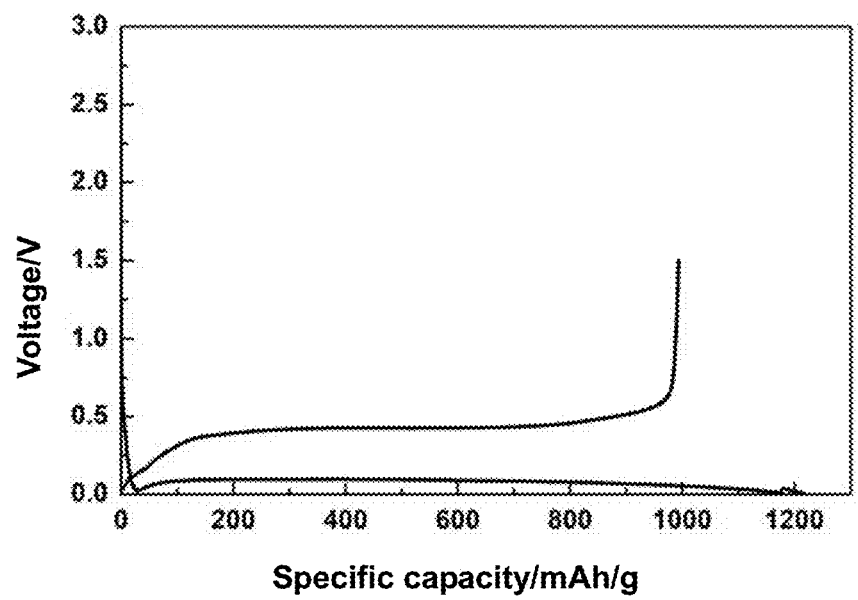
FIG. 6 is a first charge and discharge curve of the silicon-based composite material in Embodiment 3 of the invention.

In order to make the objectives, technical solutions, and advantages of the invention clearer, a detailed description will be given below in conjunction with embodiments and drawings. It should be understood that the specific embodiments described here with reference to FIGS. 1-6 are only used to explain the invention and not to limit the scope of the invention. Some non-essential changes or adjustments made by those skilled in the art with reference to the embodiments of the invention still fall within the scope of the invention.

Comparative Example 1

200 g of a nano silicon material with a particle size D50 of 50 nm was added in a rotary furnace of which the rotation speed was adjusted to 1.5 rpm, protective gas nitrogen was introduced into the rotary furnace, the nano silicon material was then heated up to 900° C. at a rate of 5° C./min, high-purity nitrogen and methane gas were introduced at speeds of 4.0 L/min and 1.5 L/min for 20 min respectively, the temperature of 900° C. was maintained for 3 h, and the product was then cooled to room temperature naturally, thus obtaining a silicon-carbon composite material.

Comparative Example 2

200 g of a nano silicon material with a particle size D50 of 50 nm was added in a rotary furnace of which the rotation speed was adjusted to 1.5 rpm, protective gas nitrogen was introduced into the rotary furnace, the nano silicon material was then heated up to 900° C. at a rate of 5° C./min, high-purity nitrogen and methane gas were introduced into the rotary furnace at 4.0 L/min and 1.5 L/min for 20 min respectively, the temperature of 900° C. was maintained for 3 h, and the product was cooled to room temperature naturally, thus obtaining a precursor. Next, 15% (calculated based on the percentage of the mass of the organic pyrolysis carbon to the total mass of the silicon-based composite material) of pitch, 85% of the precursor and alcohol were mixed and dispersed uniformly by a high-speed disperser to form a mixture; the solid content of the mixture was controlled to 20% by adjusting the amount of alcohol added; the mixture was then spray-dried and heat-treated; a high-purity protective gas was introduced into an atmosphere furnace, and the product was heated up to 900° C. at a rate of 4° C./min and maintained at this temperature for 3 h, and then cooled to room temperature naturally, thus obtaining a silicon-carbon composite material.

Embodiment 1

200 g of a nano silicon material with a particle size D50 of 50 nm was added in a rotary furnace, the rotation speed of the rotary furnace was adjusted to 1.5 rpm, protective gas nitrogen was introduced into the rotary furnace, the nano silicon material was then heated up to 700° C. at a rate of 5° C./min, high-purity nitrogen, methane gas and $SiH_4$ gas were introduced for 2 h at speeds of 4.0 L/min, 0.5 L/min, and 0.5 L/min respectively, and the product was cooled to room temperature naturally, thus obtaining a precursor. Next, 15% (calculated based on the percentage of the mass of the organic pyrolysis carbon to the total mass of the silicon-based composite material) of pitch, 85% of the precursor and alcohol were mixed and dispersed uniformly by the high-speed disperser to form a mixture; the solid content of the mixture was controlled to 20% by adjusting the amount of alcohol added; the mixture was then spray-dried and heat-treated; a high-purity protective gas nitrogen was introduced into the atmosphere furnace, and the product was heated up to 900° C. at a rate of 4° C./min and maintained at this temperature for 3 h, and then cooled to room temperature naturally, thus obtaining a silicon-based composite material.

Embodiment 2

200 g of a nano silicon material with a particle size D50 of 100 nm was added in a rotary furnace, the rotation speed of the rotary furnace was adjusted to 1.5 rpm, protective gas nitrogen was introduced into the rotary furnace, the nano silicon material was then heated up to 650° C. at a rate of 5° C./min, high-purity nitrogen gas, methane gas and $SiH_4$ gas were introduced into the rotary furnace for 1 h at speeds of 4.0 L/min, 0.5 L/min, and 1.5 L/min respectively, and the product was cooled to room temperature naturally, thus obtaining a precursor. Next, 15% (calculated based on the percentage of the mass of the organic pyrolysis carbon to the total mass of the silicon-based composite material) of pitch, 85% of the precursor and alcohol were mixed and dispersed uniformly by the high-speed disperser to form a mixture; the solid content of the mixture was controlled to 20% by adjusting the amount of alcohol added; the mixture was then spray-dried and heat-treated; a high-purity protective gas nitrogen was introduced into the atmosphere furnace, and the product was heated up to 900° C. at a rate of 4° C./min and maintained at this temperature for 3 h, and then cooled to room temperature naturally, thus obtaining a silicon-based composite material.

Embodiment 3

100 g of conductive carbon black material was added in a rotary furnace, the rotation speed of the rotary furnace was adjusted to 1.5 rpm, protective gas nitrogen was introduced into the rotary furnace, the conductive carbon black material was then heated up to 650° C. at a rate of 5° C./min, high-purity nitrogen gas, methane gas and SiHCl₃ gas were introduced into the rotary furnace for 1 h at speeds of 4.0 L/min, 0.5 L/min, and 1.5 L/min respectively, and the product was cooled to room temperature naturally, thus obtaining a precursor. Next, 15% (calculated based on the percentage of the mass of the organic pyrolysis carbon to the total mass of the silicon-based composite material) of pitch, 85% of the precursor and alcohol were mixed and dispersed uniformly by the high-speed disperser to form a mixture; the solid content of the mixture was controlled to 20% by adjusting the amount of alcohol added; the mixture was then spray-dried and heat-treated; a high-purity protective nitrogen gas was introduced into the atmosphere furnace, and the product was heated up to 900° C. at a rate of 4° C./min and maintained at this temperature for 3 h, and then cooled to room temperature naturally, thus obtaining a silicon-based composite material.

Embodiment 4

150 g of a nano silicon material with a particle size D50 of 100 nm was added in a rotary furnace, the rotation speed of the rotary furnace was adjusted to 1.5 rpm, protective gas nitrogen was introduced into the rotary furnace, the nano silicon material was then heated up to 650° C. at a rate of 5° C./min, high-purity nitrogen gas, methane gas and $SiH_4$ gas were introduced into the rotary furnace for 1 h at speeds of 4.0 L/min, 0.5 L/min, and 1.5 L/min respectively, and the product was cooled to room temperature naturally, thus obtaining a precursor. Next, 15% (calculated based on the percentage of the mass of the organic pyrolysis carbon to the total mass of the silicon-based composite material) of pitch, 85% of the precursor and alcohol were mixed and dispersed uniformly by the high-speed disperser to form a mixture; the solid content of the mixture was controlled to 20% by adjusting the amount of alcohol added; the mixture was then spray-dried and heat-treated; a high-purity protective nitrogen gas was introduced into the atmosphere furnace, and the product was heated up to 900° C. at a rate of 4° C./min and maintained at this temperature for 3 h, and then cooled to room temperature naturally, thus obtaining a silicon-based composite material.

Embodiment 5

150 g of a nano silicon material with a particle size D50 of 100 nm was added in a rotary furnace, the rotation speed of the rotary furnace was adjusted to 1.5 rpm, protective gas nitrogen was introduced into the rotary furnace, the nano silicon material was then heated up to 650° C. at a rate of 5° C./min, and high-purity nitrogen gas, methane gas and $SiH_4$ gas were introduced into the rotary furnace for 1 h at speeds of 4.0 L/min, 0.5 L/min, and 1.5 L/min respectively; and then the introduction of SiH4 was terminated, methane gas was continued to be introduced at a rate of 0.5 L/min, and the temperature was maintained for 2 h; the product was cooled to room temperature naturally, thus obtaining a precursor. Next, 15% (calculated based on the percentage of the mass of the organic pyrolysis carbon to the total mass of the silicon-based composite material) of pitch, 85% of the precursor and alcohol were mixed and dispersed uniformly by the high-speed disperser to form a mixture; the solid content of the mixture was controlled to 20% by adjusting the amount of alcohol added; the mixture was then spray-dried and heat-treated; a high-purity protective nitrogen gas was introduced into the atmosphere furnace, and the product was heated up to 900° C. at a rate of 4° C./min and maintained at this temperature for 3 h, and then cooled to room temperature naturally, thus obtaining a silicon-based composite material.

Embodiment 6

150 g of a nano silicon material with a particle size D50 of 100 nm was added in a rotary furnace, the rotation speed of the rotary furnace was adjusted to 1.5 rpm, protective gas nitrogen was introduced into the rotary furnace, the nano silicon material was then heated up to 650° C. at a rate of 5° C./min, high-purity nitrogen gas was introduced into the rotary furnace at a rate of 4.0 L/min, and then methane gas at a speed of 0.5 L/min and SiH4 gas at a speed of 1.5 L/min, at an interval of 10 min, were alternately introduced into the rotary furnace for 1 h; and then the introduction of SiH4 was terminated, and the temperature was maintained for 2 h; the product was cooled to room temperature naturally, thus obtaining a precursor. Next, 5% (calculated based on the percentage of the mass of the organic pyrolysis carbon to the total mass of the silicon-based composite material) of pitch, 95% of the precursor and alcohol were mixed and dispersed uniformly by the high-speed disperser to form a mixture; the solid content of the mixture was controlled to 20% by adjusting the amount of alcohol added; the mixture was then spray-dried and heat-treated; a high-purity protective nitrogen gas was introduced into the atmosphere furnace, and the product was heated up to 900° C. at a rate of 4° C./min and maintained at this temperature for 3 h, and then cooled to room temperature naturally, thus obtaining a silicon-based composite material.

The following methods were used to test Comparative Examples 1 to 2 and Embodiments 1 to 6:

The materials prepared in Comparative Examples 1 to 2 and Examples 1 to 6 were taken as anode materials, and respectively mixed with a binder polyvinylidene fluoride (PVDF) and a conductive agent (Super-P) in a mass ratio of 70:15:15 to form mixtures. An appropriate amount of N-methylpyrrolidone (NMP) was respectively added as a solvent to the obtained mixtures to prepare slurry. The slurry was applied to copper foils, and the copper foils were then vacuum dried and rolled to obtain anode pole pieces. Metal lithium sheets were used as the counter electrodes, 1 mol/L LiPF6 three-component mixed solvent (EC:DMC:EMC=1:1:1 (v/v)) was used as electrolyte, and polypropylene microporous membrane was used as the diaphragm; all these were assembled into CR2032 button batteries in a glove box full of inert gas. The charge and discharge tests for the button batteries were performed by 0.1C constant current charge and discharge on the LANHE battery test system provided by Wuhan Landian Electronics Co., Ltd. at room temperature under a charge and discharge voltage between 0.005V and 1.5V.

The volume expansion rates of the materials were tested and calculated in the following way: Expansion rate=(pole piece thickness after 50 cycles−pole piece thickness before the cycle)/(pole piece thickness before the cycle−copper foil thickness)*100%.

The test results are shown in Table 1:

Table 1 showing the performance test evaluation results of Comparative Examples 1 to 2 and Embodiments 1 to 6

| | 1st reversible capacity (mAh/g) | Initial Coulombic efficiency | 50 cycle capacity retention rate | Expansion rate (%) |
|---|---|---|---|---|
| Comparative Example 1 | 2014.6 | 72.2 | 32.3 | 201.5 |
| Comparative Example 2 | 1935.6 | 75.4 | 45.3 | 184.2 |
| Embodiment 1 | 1247.4 | 88.6 | 83.3 | 103.2 |
| Embodiment 2 | 2035.3 | 80.4 | 75.4 | 156.4 |
| Embodiment 3 | 1986.7 | 81.5 | 79.5 | 134.6 |
| Embodiment 4 | 1985.3 | 80.2 | 77.3 | 148.3 |
| Embodiment 5 | 1876.3 | 82.4 | 78.4 | 147.6 |
| Embodiment 6 | 1893.6 | 76.3 | 67.8 | 163.7 |

Based on the disclosure and teaching of the foregoing specification, those skilled in the art to which the invention pertains can also make changes and modifications to the foregoing embodiments. Therefore, the above description is not a limitation of the invention, and the invention is not limited to the specific embodiments disclosed and described above. Some modifications and changes to the invention, such as variations, modifications, additions, or substitutions made by those of ordinary skill in the art within the essential scope of the embodiments on the equivalent replacement of various raw materials, the addition of auxiliary components, the selection of specific methods, etc., should also fall within the protection scope of the claims of the invention.

What is claimed is:

1. A silicon-carbon composite material, comprising:
   a matrix core;
   a silicon-carbon composite shell which is formed by uniformly dispersing a plurality of nano silicon particles in conductive carbon; and
   a coating layer which is a carbon coating layer including at least one layer, a thickness of a single layer of the coating layer being 0.2-3 μm;
   wherein the nano silicon particles are formed by high-temperature pyrolysis of a silicon source, and the conductive carbon is formed by high-temperature pyrolysis of an organic carbon source;
   wherein the silicon-carbon composite material has a particle size D50 of 2-20 μm, a specific surface area of 1-30 $m^2/g$, and a true density of 1-3 $g/cm^3$, and a particle size D50 of the matrix core of the silicon-carbon composite material is 2-18 μm.

2. The silicon-carbon composite material according to claim 1, wherein
   the matrix core contains any one or two of nano silicon, nano silicon oxide (SiOx), and nano conductive carbon material;
   the nano silicon has a particle size D50 of 5-300 nm and comprises any one or more of single-crystal nano silicon with a grain size of 1-40 nm, polycrystalline nano silicon with a grain size of 1-40 nm and amorphous nano silicon;
   X in SiOx is 0.8-1.5; and
   the nano conductive carbon material is conductive carbon black, carbon nanotubes or graphene.

3. The silicon-carbon composite material according to claim 2, wherein the single-crystal nano silicon is a single-crystal nano silicon wire prepared on a gold-plated silicon wafer by a chemical vapor deposition method.

4. The silicon-carbon composite material according to claim 2, wherein the nano conductive carbon material is a graphene composite material loaded with amorphous carbon.

5. The silicon-carbon composite material according to claim 4, wherein the graphene composite material loaded with amorphous carbon is prepared in the following way: mixing a graphene oxide solution uniformly dispersed at a single layer with amorphous carbon, stirring at room temperature, drying, carrying out preheating treatment under an inert gas atmosphere, cooling, carrying out reduction reaction in a reducing atmosphere, and cooling.

6. A preparation method of the silicon-carbon composite material according to claim 1, comprising the following steps:
   S1: placing a matrix core in a CVD furnace, heating the matrix core up to a temperature of 400-1200° C. at a rate of 1-15° C./min under a protective atmosphere to simultaneously vapor-deposit both nano silicon particles and conductive carbon, maintaining the matrix core at the temperature for 0.5-20 h, and cooling the matrix core naturally, thereby obtaining a silicon-carbon composite precursor; and
   S2: performing carbon coating on the silicon-carbon composite material precursor, thereby obtaining the silicon-carbon composite material;
   wherein the simultaneous vapor deposition of both nano silicon particles and conductive carbon is implemented by introducing simultaneously a carbon source and a silicon source at a predetermined ratio at a rate of 0.5-20.0 L/min; the silicon source comprises one or more of $SiH_4$, $SiHCl_3$, $Si_2H_6$, $Si_3H_8$, $SiCl_4$, $Si_2Cl_6$, $SiH_2Cl$, and $SiH_3Cl$.

7. The preparation method of the silicon-carbon composite material according to claim 6, wherein the carbon coating is high-temperature pyrolysis carbon coating, liquid-phase carbon coating or gas-phase carbon coating, a coating layer formed in the carbon coating has a thickness of 10-2000 nm.

8. The preparation method of the silicon-carbon composite material according to claim 7, wherein the high-temperature pyrolysis carbon coating is one-step carbon coating or two-step carbon coating.

9. The preparation method of the silicon-carbon composite material according to claim 7, wherein the high-temperature pyrolysis carbon coating is two-step carbon coating comprising a first carbon coating process and a second carbon coating process, and a coating amount formed in the second carbon coating process is 0.1-10 times, by mass, that formed in the first carbon coating process.

10. The preparation method of the silicon-carbon composite material according to claim 7, wherein the liquid-phase carbon coating includes:
    uniformly mixing and dispersing an organic carbon source, a to-be-coated material, and a solvent by a high-speed disperser to form a slurry;
    performing spray drying and heat treatment on the slurry;
    introducing a high-purity protective gas into an atmosphere furnace in which the slurry after heat treatment is placed, heating the atmosphere furnace up to a temperature of 400-1200° C. at a heating rate less than 10° C./min for sintering, maintaining the atmosphere furnace at the temperature for 0.5-10 h, and
    cooling the atmosphere furnace to a room temperature naturally, thereby obtaining a liquid-phase coating product;
    wherein a mass of pyrolyzed carbon from the organic carbon source accounts for 1-99 wt % of a total mass of the liquid-phase coating product; and
    wherein a solid content of the slurry is controlled to 5-50% by adjusting an amount of the solvent added.

11. The preparation method of the silicon-carbon composite material according to claim 7, wherein the gas-phase carbon coating comprises:

placing a to-be-coated material in a CVD furnace, introducing a protective gas into the furnace, heating the furnace up to a temperature of 500-1200° C. at a rate of 1-15° C./min, introducing an organic carbon source gas into the furnace at a rate of 0.5-20.0 L/min, keeping the furnace at the temperature for 0.5-20 h, and cooling the furnace to room temperature naturally, thereby obtaining a gas-phase coating product.

* * * * *